United States Patent
Chen et al.

(10) Patent No.: US 8,816,735 B1
(45) Date of Patent: Aug. 26, 2014

(54) PHASE-LOCKED LOOP CIRCUIT

(71) Applicant: Taiwan Semiconductor Manufacturing Co., Ltd., Hsinchu (TW)

(72) Inventors: Huan-Neng Chen, Taichung (TW); Kuang-Kai Yen, Kaohsiung (TW); Feng-Wei Kuo, Hsinchu County (TW); Hsien-Yuan Liao, Changhua County (TW); Tsung-Hsiung Lee, New Taipei (TW); Chewn-Pu Jou, Hsinchu County (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

(21) Appl. No.: 14/062,738

(22) Filed: Oct. 24, 2013

(51) Int. Cl.
*H03L 7/06* (2006.01)
*H03L 7/08* (2006.01)

(52) U.S. Cl.
CPC .................................... *H03L 7/08* (2013.01)
USPC .......................................... 327/158; 327/149

(58) Field of Classification Search
USPC ................................................. 327/149, 158
See application file for complete search history.

(56) References Cited

U.S. PATENT DOCUMENTS

| | | | |
|---|---|---|---|
| 7,183,860 B2* | 2/2007 | Staszewski et al. ........... | 331/1 A |
| 7,801,262 B2* | 9/2010 | Wallberg et al. .............. | 375/376 |
| 8,373,472 B2* | 2/2013 | Thaller et al. ................. | 327/158 |
| 8,432,199 B2* | 4/2013 | Lee et al. ...................... | 327/156 |
| 8,508,266 B2* | 8/2013 | Frantzeskakis et al. ...... | 327/156 |
| 8,593,189 B1* | 11/2013 | Yen et al. ...................... | 327/156 |
| 2009/0052508 A1* | 2/2009 | Takahashi ..................... | 375/219 |
| 2011/0148490 A1* | 6/2011 | Lee et al. ...................... | 327/159 |
| 2011/0227621 A1* | 9/2011 | Ridgers ......................... | 327/159 |
| 2012/0161832 A1* | 6/2012 | Lee et al. ...................... | 327/156 |
| 2012/0319749 A1* | 12/2012 | Thaller et al. ................. | 327/158 |
| 2013/0002317 A1* | 1/2013 | Frantzeskakis et al. ...... | 327/156 |
| 2013/0187688 A1* | 7/2013 | Wang et al. ................... | 327/156 |
| 2014/0021991 A1* | 1/2014 | Frantzeskakis et al. ...... | 327/159 |
| 2014/0021992 A1* | 1/2014 | Frantzeskakis et al. ...... | 327/159 |

OTHER PUBLICATIONS

Minjae Lee et al., "A Low Noise, Wideband Digital Phase-locked Loop based on a New Time-to-Digital Converter with Subpicosecond Resolution", 2008 Symposium on VLSI Ciruits Digest of Technical Papers, IEEE, pp. 112-113.

(Continued)

*Primary Examiner* — Adam Houston
(74) *Attorney, Agent, or Firm* — McDermott Will & Emery LLP

(57) ABSTRACT

A phase-locked loop circuit, a phase converter module thereof and a phase-locked controlling method are disclosed herein. The phase converter module is suitable for a phase-locked loop circuit including a digitally-controlled oscillator (DCO) for generating an oscillator output signal and a divider for converting the oscillator output signal into N-phased oscillator output signals. The phase converter module includes a phase finder and a time-to-digital converter. The phase finder is configured for sampling the oscillator output signal with the N-phased oscillator output signals to calculate an estimated value of a fractional phase part. One oscillation period of the digitally-controlled oscillator is divided into N sub-periods. The time-to-digital converter is configured for sampling one of the N-phased oscillator output signals with a reference-frequency signal to calculate a precise value of the fractional phase part within one sub-period.

19 Claims, 7 Drawing Sheets

(56) References Cited

OTHER PUBLICATIONS

V. Ramakrishnan et al., "A Wide-Range, High-Resolution, Compact, CMOS Time to Digital Converter", Proceedings of the 19th International Conference on VLSI Design, IEEE Computer Society, 2006, 6 pgs.

Julie R. Hu et al., "A. 1.56GHz Wide-Tuning All Digital FBAR-Based PLL in 0.13µm CMOS", IEEE, 2010, 4 pgs.

* cited by examiner

PHASE-LOCKED LOOP CIRCUIT

BACKGROUND

A phase-locked loop (PLL) is an electronic control system that generates an oscillating signal having a fixed phase relationship (e.g., synchronized or having a fixed gap) with a reference signal. A phase-locked loop circuit automatically raises or decreases a frequency of a controlled oscillator until the frequency matches the reference signal in both frequency and phase. An all digital PLL (ADPLL) is a digital system implemented with digital logics. An ADPLL circuit may include a time-to-digital converter (TDC). The TDC is configured for sampling the oscillation signal at a predetermined resolution, and feeding the sampled signal back to the phase detector, so as to raise or lower the frequency of input signals of the ADPLL circuit.

BRIEF DESCRIPTION OF THE DRAWINGS

The disclosure can be more fully understood by reading the following detailed description of the embodiments, with reference made to the accompanying drawings as follows.

DETAILED DESCRIPTION

Figure 1:
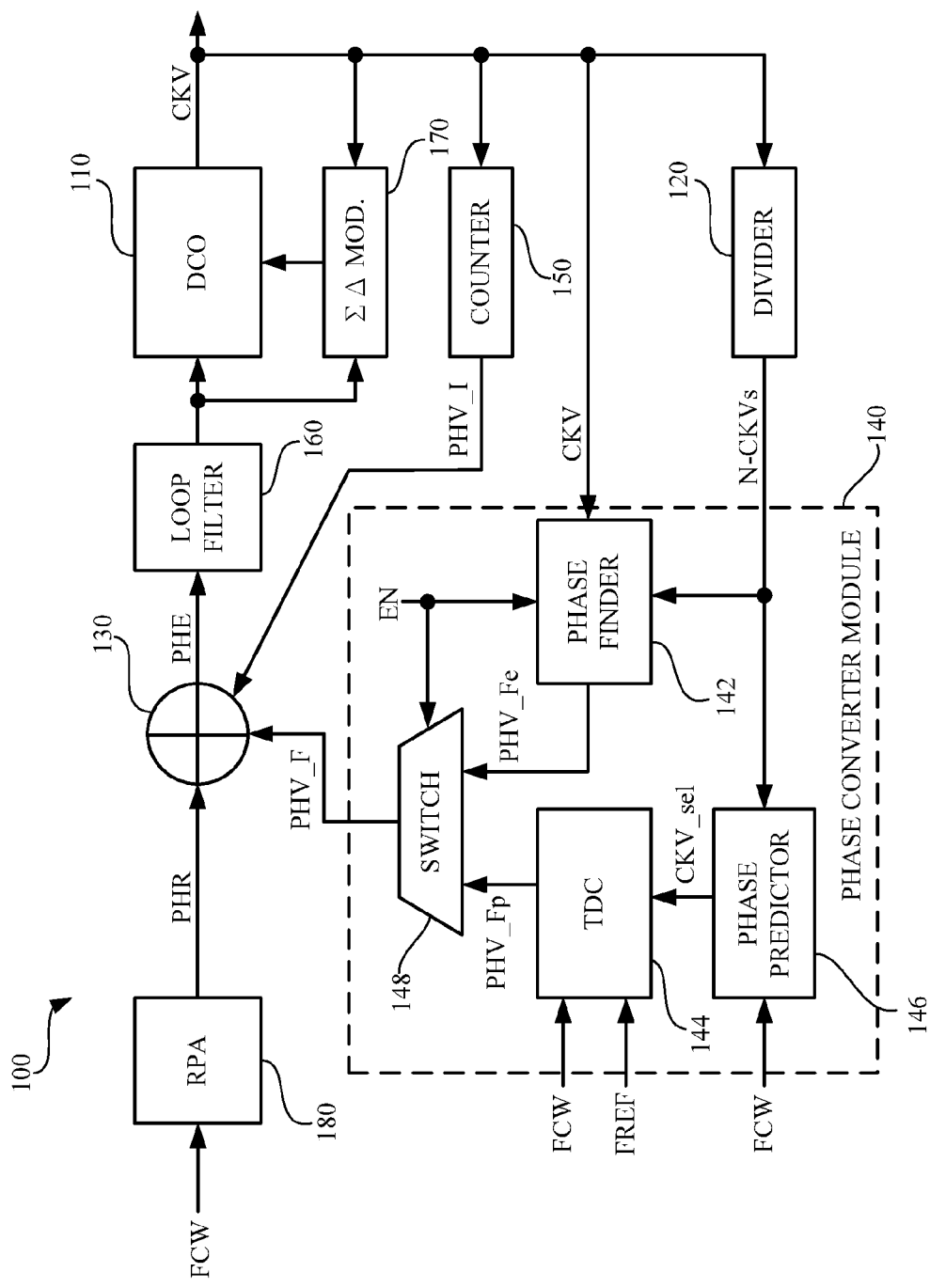
FIG. 1 is a functional block diagram illustrating the phase-locked loop circuit according to embodiments of the disclosure.

Reference is made to FIG. 1. FIG. 1 is a functional block diagram illustrating a phase-locked loop circuit 100 according to some embodiments of the present disclosure. As shown in FIG. 1, the phase-locked loop circuit 100 includes a digitally-controlled oscillator (DCO) 110, a divider 120, a controller 130 and a phase converter module 140. In some embodiments, the phase-locked loop circuit 100 further includes a counter 150, a loop filter 160, a sigma-delta (ΣΔ) modulator 170 and a reference phase accumulator (RPA) 180.

The digitally-controlled oscillator 110 is configured to generate an oscillator output signal CKV, which has an assigned oscillation frequency and an oscillation phase. The oscillation frequency and the oscillation phase of the oscillator output signal CKV is controlled by a DCO control signal PHE generated by the controller 130. In practice, the controller 130 can be a phase detector (PD) in the PLL circuit 100.

In some embodiments, the digitally-controlled oscillator 110 is a numerically controlled oscillator (NCO). Explained in a different way, the digitally-controlled oscillator 110 generates the oscillator output signal CKV at different frequencies according to a reference numerical index. The controller 130 generates the DCO control signal (as the reference numerical index) in accordance with an integral phase part PHV_I and a fractional phase part PHV_F, which are sampled and fed back from the oscillator output signal CKV.

In some embodiments, the counter 150 disposed between the digitally-controlled oscillator 110 and the controller 130 is configured for counting a count value according to the oscillator output signal CKV, and outputting the count value as the integral phase part PHV_I. For illustration, the count value represents how many rising edges of the oscillator output signal CKV is counted in a predetermined time period. If the count value is lower than the reference numerical index, it means that the frequency of the oscillator output signal CKV is too low, and then the controller 130 needs to raise the frequency of the digitally-controlled oscillator 110 accordingly. For example, the count value that is equal to 2 is smaller than the reference numerical index that is equal to 3.2. In this case, the integral phase part PHV_I (i.e., the count value) generated by the counter 130 determines the oscillation frequency of the oscillator output signal CKV.

On the other hand, the fractional phase part PHV_F substantially determines the phase of the oscillator output signal CKV. In some embodiments, the fractional phase part PHV_F is generated by the phase converter module 140 according to the oscillator output signal CKV and N-phased oscillator output signals N-CKVs.

Figure 2:
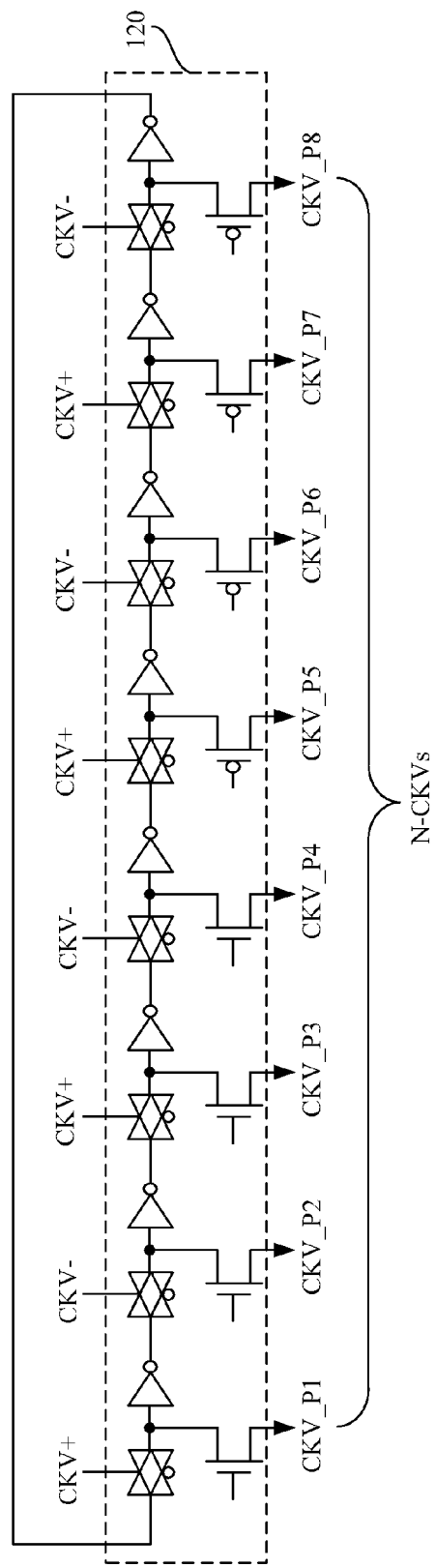
FIG. 2 is a schematic diagram illustrating the divider in FIG. 1 according to embodiments of this disclosure.

In some embodiments, the oscillator output signal CKV is converted by the divider 120 into N-phased oscillator output signals N-CKVs. Reference is also made to FIG. 2, which is a schematic diagram illustrating the divider 120 in FIG. 1 according to embodiments of this disclosure. As shown in FIG. 1 and FIG. 2, the divider 120 is connected to the digitally-controlled oscillator 110 and receives two opposite phases of the oscillator output signal CKV (including a positive output signal CKV+ and a negative output signal CKV−). For illustration in FIG. 2, the oscillator output signal CKV is converted into 8-phased oscillator output signals by the divider 120. In some embodiments, the divider 120 is a divider by 4. In such case, the positive output signal CKV+ and the negative output signal CKV− are processed by the divider by 4 and converted into the 8-phased oscillator output signals (the phase signals CKV_P1, CKV_P2, CKV_P3 . . . , CKV_P8). However, the disclosure is not limited to this. In some other embodiments, the N-phased oscillator output signals are 4-phased (converted by a divider by 2), 6-phased (converted by a divider by 3), 10-phased (converted by a divider by 5), or any equivalent phased oscillator output signals.

For illustration, the 8-phased oscillator output signals, which include the phase signals CKV_P1, CKV_P2, CKV_P3 . . . , CKV_P8, are separated by an equal phase angle. For example, the first phase signal CKV_P1 and the second phase signal CKV_P2 are separated by $\pi/4$ ($2\pi/8$) in-between; the second phase signal CKV_P2 and the third phase signal CKV_P3 are also separated by $\pi/4$ in-between, and so on. In some other embodiments, the oscillator output signal CKV is divided into N phases, each as phase signals CKV_P1, CKV_P2, CKV_P3 . . . , CKV_Pn.

Figure 3A:
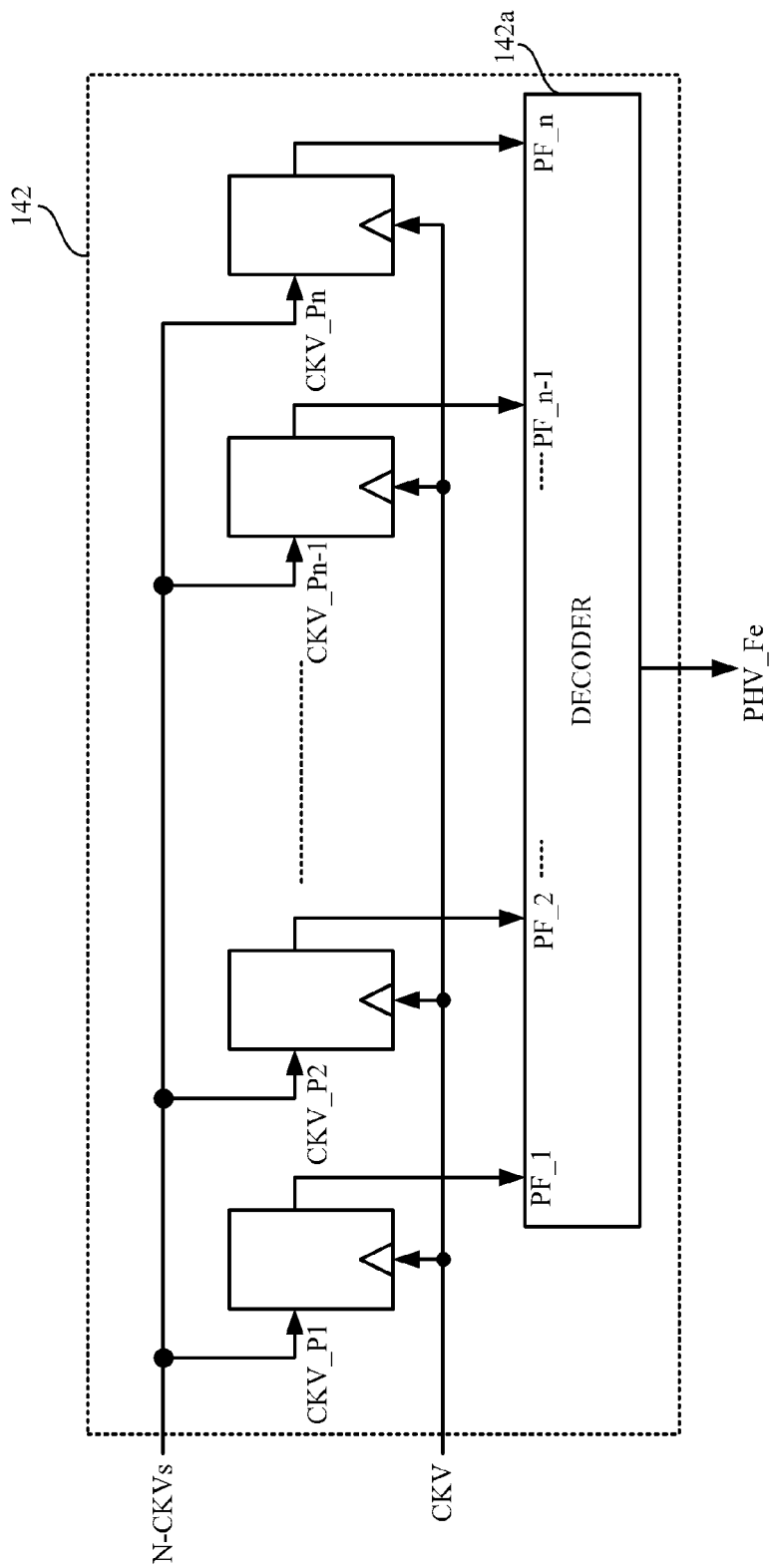
FIG. 3A is a schematic diagram illustrating the phase finder according to embodiments of the disclosure.
Figure 3B:
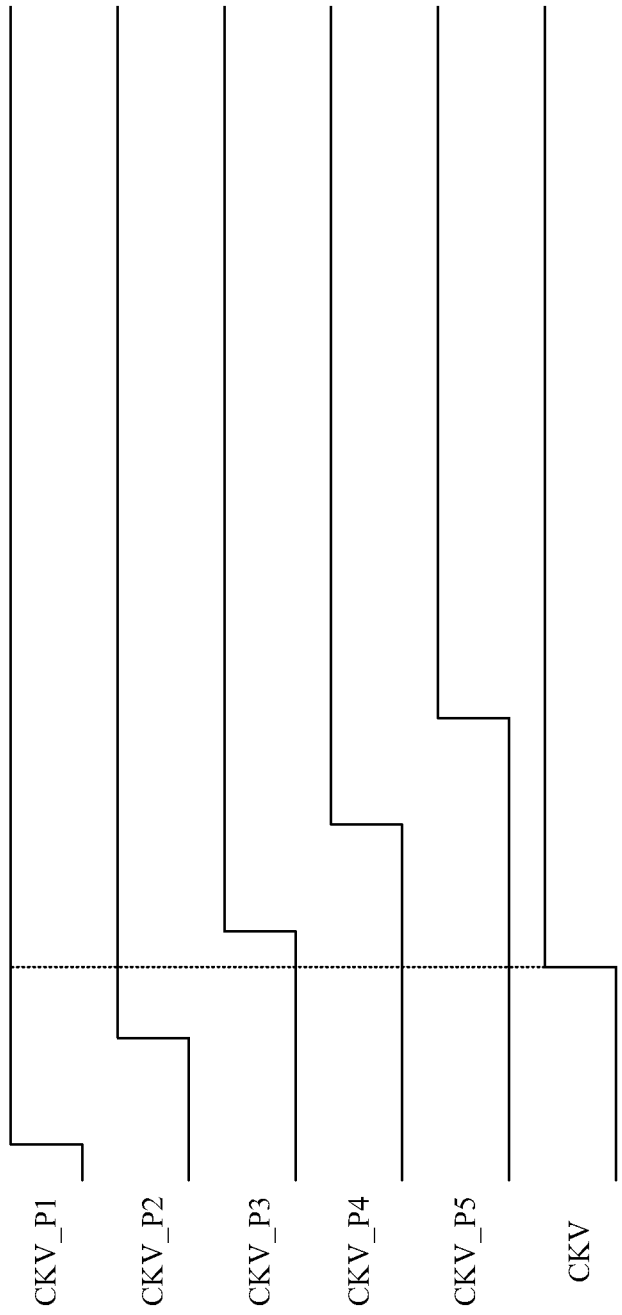
FIG. 3B is a schematic diagram illustrating an operational example of the phase finder according to embodiments of the disclosure.
Figures 5A, 5B:
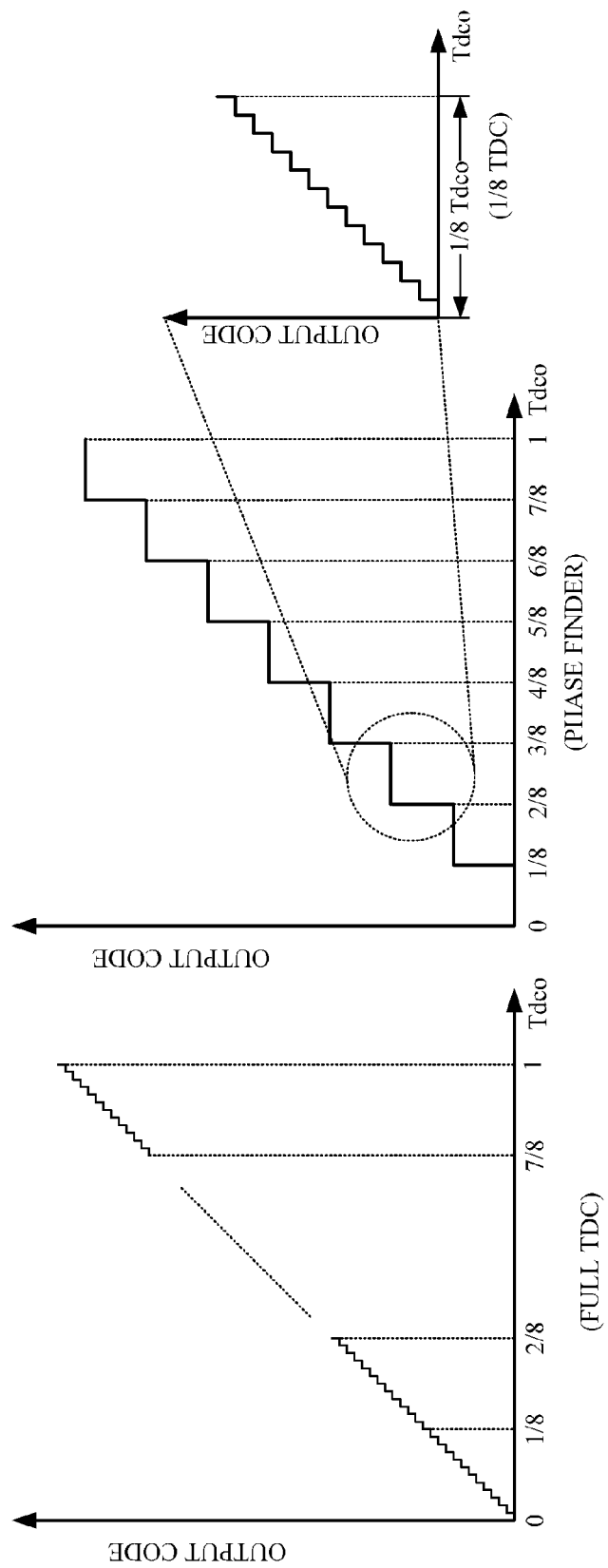
FIG. 5A and FIG. 5B are schematic diagrams illustrating comparison between a conventional TDC and two-steps for calculating the fractional phase part of this disclosure.

The phase converter module 140 includes a phase finder 142 and a time-to-digital converter (TDC) 144. In some embodiments, the phase finder 142 is a fast phase finder for calculating an estimated value PHV_Fe of the fractional phase part PHV_F. Reference is also made to FIG. 3A, FIG. 3B and FIG. 5B. FIG. 3A is a schematic diagram illustrating the phase finder 142 according to some embodiments of present the disclosure. FIG. 3B is a schematic diagram illustrating an operation of the phase finder 142 according to some embodiments of the present disclosure.

As shown in FIG. 5B, one oscillation period Tdco (reciprocal of the oscillation frequency) of the digitally-controlled oscillator 110 is divided into 8 sub-periods corresponding to the 8-phased oscillator output signals (i.e., N=8 in embodiments shown in FIG. 5B). The phase finder 142 detects which sub-period of the eight sub-periods (0 to 1/8 Tdco, 1/8 to 2/8 Tdco, 2/8 to 3/8 Tdco ..., 7/8 to 1 Tdco) does the oscillator output signal CKV match. In some embodiments, the phase finder 142 generates an output code according to which sub-period of the eight sub-periods is matched with the oscillator output signal CKV. The number of sub-periods shown in FIG. 5B is given for illustrative purposes. Various numbers of sub-periods are within the contemplated scope of the present disclosure.

As shown in FIG. 3A, the phase finder 142 includes eight stages of logic circuits. to These eight stages of the logic circuits are connected in parallel with each other. Each stage receives one of the N-phased oscillator output signals N-CKVs and the oscillator output signal CKV. Each stage of logic circuits in the phase finder 142 compares one phase from the N-phased oscillator output signals (the phase signals CKV_P1, CKV_P2, ..., CKV_Pn−1 CKV_Pn) with the oscillator output signal CKV. The outcomes (PF_1, PF_2 ..., PF_n−1, PF_n) of the comparison are gathered and converted by a decoder 142a into the estimated value PHV_Fe of the fractional phase part PHV_F.

In the operational example, shown in FIG. 3B, if the oscillator output signal CKV has a rising edge between the rising edges of the phase signals CKV_P2 and CKV_P3, the outcomes [PF_1, PF_2, PF_3, PF_4, ..., PF_n−1, PF_n] will be [1, 1, 0, 0, ..., 0, 0]. The N-digit outcomes represent the phase of the oscillator output signal CKV is between the phase signals CKV_P2 and CKV_P3. Therefore, the phase finder 142 may figure out the phase signals CKV_P2 and CKV_P3 has phases approximate to the real oscillator output signal CKV.

In this case, the phase finder 142 may select one phase signal CKV_P3 (or it can be CKV_P2) among N-phased oscillator output signals N-CKVs as the approximate phase signal, such to calculate the estimated value PHV_Fe. In this case, after the phase finder 142 is activated and select the approximate phase signal, the phase finder 142 ensures that a phase error between the oscillator output signal CKV and the selected phase signal CKV_P3 will be less than one sub-period (i.e., 1/8 Tdco or $2\pi/8$ when N=8). In other words, the phase finder 142 may roughly calculate the estimated value PHV_Fe by selecting one from N sub-periods (each of them covers 1/8 oscillation period Tdco when N=8).

Afterword, the time-to-digital converter 144 shown in FIG. 1 is configured for sampling the selected phased signal CKV_sel (e.g., the selected phased signal CKV_P3) with a reference-frequency signal FREF to calculate a precise value PHV_Fp of the fractional phase part PHV_F within one sub-period (1/N oscillation period Tdco). The reference-frequency signal FREF represents the assigned frequency to the digitally-controlled oscillator 110.

In some embodiments, the phase finder 142 is activated when the phase error of the oscillator output signal is still larger than one sub-period. After the phase finder 142 figures out the selected phase signal, the phase error is less than one sub-period, and then the phase finder 142 is deactivated and the time-to-digital converter 144 is activated. In some embodiments, the phase converter module 140 further includes a phase predictor 146 and a switch 148.

When the phase finder 142 is activated, the switch 148 of the phase converter module 140 bypasses the estimated value PHV_Fe as the fractional phase part PHV_F. When the phase finder 142 is deactivated and the time-to-digital converter 144 is activated, the switch 148 bypasses the precise value PHV_Fp as the fractional phase part PHV_F.

The phase predictor 146 is configured for selecting one phase signal from the N-phased oscillator output signals N-CKVs according to a frequency command word FCW and providing the selected phase signal CKV_sel to the time-to-digital converter 144. The phase predictor 146 can be initialized by the selected phase signal (e.g., CKV_P3 in aforesaid example) picked by the phase finder 142. After the phase finder 142 is deactivated, the phase predictor 146 is configured for providing a correct selected phase signal CKV_sel for subsequent periods of the oscillator output signal CKV.

Figure 4:
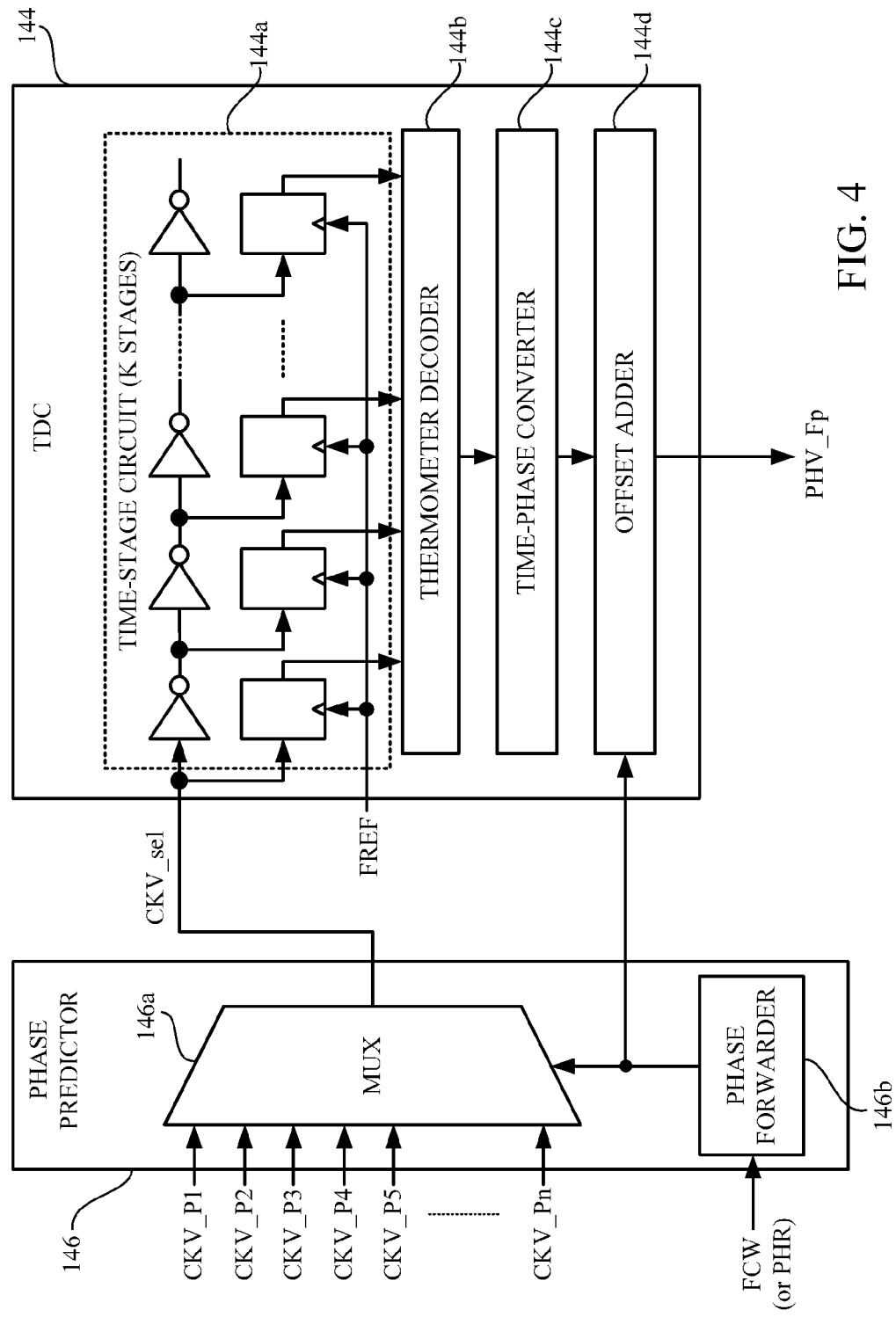
FIG. 4 is a schematic diagram illustrating the time-to-digital converter and the phase predictor according to embodiments of the disclosure.

Reference is also made to FIG. 4. FIG. 4 is a schematic diagram illustrating the time-to-digital converter 144 and the phase predictor 146.

As shown in FIG. 4, the phase predictor 146 may include a multiplexer 146a and a phase forwarder 146b. In some embodiments, the phase forwarder 146b is configured for predicting which sub-period will the next oscillator output signal match according to the frequency command word FCW. For illustration, the frequency command word represents the reference numerical index. For example, when the reference numerical index is equal to 3.2, the next period of the oscillator output signal shall be 3.2*2=6.4; and, the second next period shall be 3.2*3=9.6, etc. In some embodiments, the phase forwarder 146b predicts which sub-period will the next oscillator output signal match, and such that the multiplexer 146a chooses the corresponding selected phase signal CKV_sel from the N-phased oscillator output signals N-CKVs (e.g., CKV_P1~CKV_Pn) according to the prediction of the phase forwarder 146b. In some other embodiments, the phase forwarder 146b predicts the sub-period according to a reference phase signal PHR, which is converted from the frequency command word FCW by the reference phase accumulator (RPA) 180.

As shown in FIG. 4, the time-to-digital converter 144 shown in FIG. 4 includes a time-stage circuit 144a, a thermometer decoder 144b, a time-phase converter 144c and an offset adder 144d. Reference is also made to FIG. 5A and FIG. 5B. FIG. 5A and FIG. 5B are schematic diagrams illustrating comparison between a conventional TDC and two-steps (by the phase finder 142 and the time-to-digital converter 144) for calculating the fractional phase part PHV_F of this disclosure.

In some approaches illustrated in FIG. 5A, a TDC must cover one full period of the oscillation period Tdco. In order to achieve a resolution of 96 stages, the TDC must be capable of sampling the phase of the oscillator output signal CKV into 96 tiny phase-periods and outputs 96 different output codes according to the sampling outcome. The TDC requires 96-stage logic circuits for sampling the oscillator output signal. Therefore, the TDC covering full period of the oscillation period Tdco must be operated at a relative high frequency and have a relative complex circuit structure.

Compared to the approaches illustrated in FIG. 5A, for illustration in FIG. 5B, the phase finder 142 (referring to FIG. 1 and FIG. 3 in embodiments of this disclosure roughly find out the approximate phase region (one selected from the eight phases) of the oscillator output signal CKV. The time-to-digital converter 144 in this disclosure is only required to 1/N period of the oscillation period Tdco, instead of covering the full period of the oscillation period Tdco.

To be noticed that, the time-stage circuit 144a shown in FIG. 4 include K stages of logic circuits for sampling the selected phased signal CKV_sel (e.g., the selected phased signal CKV_P3) with the reference-frequency signal FREF to calculate the precise value PHV_Fp of the fractional phase part PHV_F within one sub-period (1/8 oscillation period Tdco in embodiments of N=8). For example, the time-stage circuit may only include 12 stages of logic circuits (K=12), such that the resolution provided by the phase converter module 140 (shared by the phase finder 142 and the time-to-digital converter 144) is equivalent to 8 (phases)*12(stages)=96. In aforesaid embodiments, the N is taken as 8 for demonstration, and the K is taken as 12 for demonstration, however the disclosure is not limited thereto. In some other embodiments, to achieve different resolutions of phase-locked operation, the phase finder 142 may divide the one oscillation period of the digitally-controlled oscillator is divided into N sub-periods and the time-stage circuit 144a may include K stages of logic circuits, wherein N*K≥the required resolution, and N and K are positive integers.

Based on aforesaid embodiments, the phase converter module 140 includes the fast N-phased phase finder 142 and the precise time-to-digital converter 144 covering only 1/N oscillation period Tdco. The phase converter module 140 may find out the phase of the oscillator output signal CKV effectively with a high resolution, and does not require a complex logic circuits (with lots of stages) for sampling the oscillator output signal CKV.

As shown in FIG. 1, the phase-locked loop circuit 100 also includes the loop filter 160, the sigma-delta (ΣΔ) modulator 170 and the reference phase accumulator 180.

The loop filter 160 is disposed between the digitally-controlled oscillator 110 and the controller 130. The sigma-delta (ΣΔ) modulator 170 is configured for synchronizing the phases between the output signal (i.e., the oscillator output signal CKV) and the input signal of the digitally-controlled oscillator 110. The reference phase accumulator (RPA) 180 is configured for receiving the frequency command word (FCW) and accordingly generating a reference phase signal PHR to the controller. The operations of the loop filter 160, the sigma-delta (ΣΔ) modulator 170 and the reference phase accumulator 180 are known by a person in the art, and not to be mentioned here.

Figure 6:
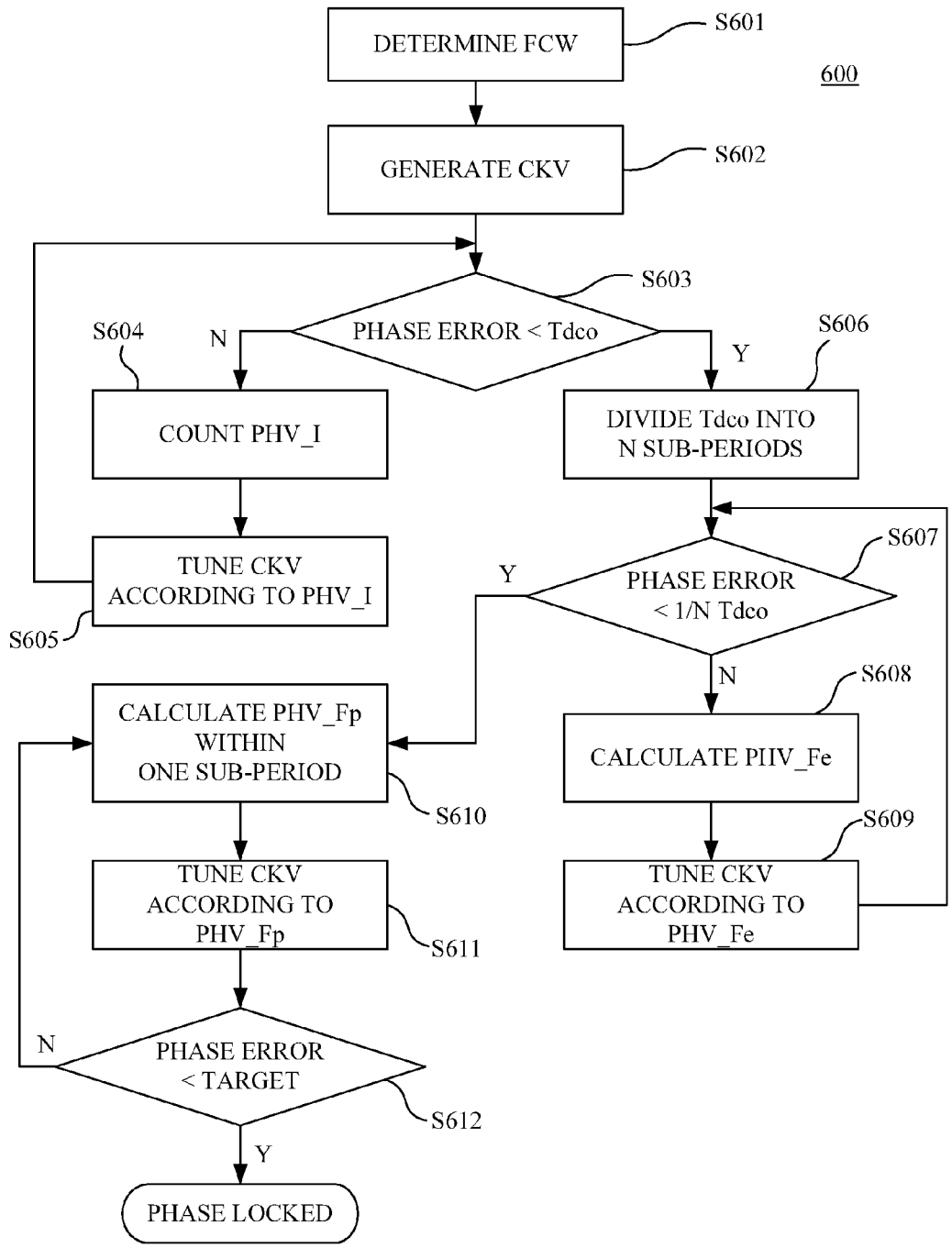
FIG. 6 is a schematic diagram illustrating a phase-locked controlling method according to embodiments of the disclosure.

Reference is made to FIG. 6, which is a schematic diagram illustrating a phase-locked controlling method 600 according to embodiments of the disclosure. The phase-locked controlling method 600 is described below with reference to the phase-locked loop circuit 100 of the embodiments shown in FIG. 1 to FIG. 4.

As shown in FIG. 6, the phase-locked controlling method 600 executes step S601 for determining a frequency control word (referring to FCW in FIG. 1) for setting an oscillation frequency of an oscillator output signal (referring to CKV in FIG. 1). Step S602 is executed for generating the oscillator output signal CKV. Then, a phase error of the oscillator output signal CKV is detected, and step S603 is executed for determining if the phase error of the oscillator output signal is less the one oscillation period (referring to Tdco in FIG. 5B) of the oscillator output signal CKV. If the phase error is larger than one oscillation period Tdco of the oscillator output signal CKV, step S604 is executed for activating a counter (referring to 150 in FIG. 1) for counting an integral phase part (referring to PHV_I in FIG. 1) according to the oscillator output signal CKV. Then, step S605 is executed for tuning the oscillator output signal CKV according to the integral phase part PHV_I.

If the phase error of the oscillator output signal CKV is less the one oscillation period Tdco, step S606 is executed for dividing one oscillation period of the digitally-controlled oscillator into N sub-periods.

Step S607 is executed for determining if the phase error of the oscillator output signal is less the 1/N oscillation period (i.e., 1/N Tdco=one sub-period).

If the phase error is less than one oscillation period of the oscillator output signal and larger than 1/N oscillation period, a phase finder (referring to 142 in FIG. 1 and FIG. 3A) is activated, and step S608 is executed for detecting which sub-period does the oscillator output signal match and calculating an estimated value (referring to PHV_Fe in FIG. 1 and FIG. 3A) of a fractional phase part (referring to PHV_F in FIG. 1). Step S609 is executed for tuning the oscillator output signal according to the estimated value of the fractional phase part.

If the phase error is less than 1/N oscillation period (i.e., 1/N Tdco=one sub-period), the phase finder is deactivated and a time-to-digital converter (referring to 144 in FIG. 1 and FIG. 4) is activated, and step 5610 is executed for calculating a precise value (referring to PHV_Fp in FIG. 1 and FIG. 4) of the fractional phase part PHV_F within one sub-period. Step 5611 is executed for tuning the oscillator output signal CKV according to the precise value PHV_Fp of the fractional phase part PHV_F.

Step 5612 is executed for determining if the phase error of the oscillator output signal is less than a target error. If the phase error is less than the target error, the phase is settled and the phase-locked loop circuit 100 may lock the frequency and the phase of the oscillator output signal CKV.

In some embodiments, a phase-locked loop circuit is disclosed that includes a digitally-controlled oscillator (DCO), a controller, a divider, and a time-to-digital converter (TDC) module. The digitally-controlled oscillator (DCO) is configured for generating an oscillator output signal having an oscillation frequency. The controller is configured for generating a DCO control signal for setting the oscillation frequency in accordance with an integral phase part and a fractional phase part of the oscillator output signal. The divider is configured for converting the oscillator output signal into N-phased oscillator output signals. The time-to-digital converter (TDC) module is configured for determining the fractional phase part according to the oscillator output signal and the N-phased oscillator output signals. The phase converter module includes a phase finder and a time-to-digital converter. The phase finder is configured for sampling the oscillator output signal with the N-phased oscillator output signals to calculate an estimated value of the fractional phase part. One oscillation period of the digitally-controlled oscillator is divided into N sub-periods. The phase finder detects which sub-period of the N sub-periods the oscillator output signal matches. The time-to-digital converter is configured for sampling one of the N-phased oscillator output signals with a reference-frequency signal to calculate a precise value of the fractional phase part within one sub-period.

Also disclosed is a phase converter circuit, suitable for a phase-locked loop circuit including a digitally-controlled oscillator (DCO) for generating an oscillator output signal and a divider for converting the oscillator output signal into N-phased oscillator output signals. The phase converter circuit includes a phase finder and a time-to-digital converter. The phase finder is configured for sampling the oscillator output signal with the N-phased oscillator output signals to calculate an estimated value of a fractional phase part. One oscillation period of the digitally-controlled oscillator is divided into N sub-periods. The phase finder detects which sub-period of the N sub-periods the oscillator output signal matches. The time-to-digital converter is configured for sampling one of the N-phased oscillator output signals with a reference-frequency signal to calculate a precise value of the fractional phase part within one sub-period.

A phase-locked controlling method, suitable for a phase-locked loop circuit, is also disclosed that includes the steps outlined below. A frequency control word for setting an oscillation frequency of an oscillator output signal is determined. The oscillator output signal is generated. One oscillation period of the digitally-controlled oscillator is divided into N sub-periods. A phase error of the oscillator output signal is detected. If the phase error is less than one oscillation period of the oscillator output signal and larger than 1/N oscillation period, which sub-period matches the oscillator output signal is detected and an estimated value of a fractional phase part is calculated. If the phase error is less than 1/N oscillation period, a precise value of the fractional phase part within one sub-period is calculated. The oscillator output signal is tuned according to the fractional phase part.

It will be apparent to those skilled in the art that various modifications and variations can be made to the structure of the present disclosure without departing from the scope or spirit of the application. In view of the foregoing, it is intended that the present disclosure cover modifications and variations of this application provided they fall within the scope of the following claims.

What is claimed is:

1. A circuit, comprising:
  a digitally-controlled oscillator (DCO) configured for generating an oscillator output signal;
  a controller configured for setting an oscillation frequency of the oscillator output signal in accordance with a fractional phase part;
  a divider configured for converting the oscillator output signal into N-phased oscillator output signals; and
  a phase converter module, comprising:
    a phase finder comprising N stages of logic circuits connected in parallel, each stage of the logic circuits configured for sampling the oscillator output signal with one of the N-phased oscillator output signals for calculating an estimated value of the fractional phase part; and
    a time-to-digital converter configured for sampling one of the N-phased oscillator output signals with a reference-frequency signal to calculate a precise value of the fractional phase part.

2. The circuit of claim 1, wherein one oscillation period of the digitally-controlled oscillator is divided into N sub-periods, the phase finder detects which sub-period the oscillator output signal match, and the time-to-digital converter calculate the precise value of the fractional phase part within one sub-period.

3. The circuit of claim 2, wherein the phase finder is activated when a phase error of the oscillator output signal is larger than one sub-period, and the phase finder is deactivated and the time-to-digital converter is activated when a phase error of the oscillator output signal is less than one sub-period.

4. The circuit of claim 2, wherein the phase converter module further comprises a phase predictor configured for selecting one phase signal from the N-phased oscillator output signals according to a frequency command word (FCW) and providing the selected phase signal to the time-to-digital converter.

5. The circuit of claim 4, wherein the phase predictor comprises:
  to a phase forwarder configured for predicting which sub-period will the next oscillator output signal match according to the frequency command word (FCW); and
  a multiplexer configured for selecting the phase signal from the N-phased oscillator output signals according to the prediction of the phase forwarder.

6. The circuit of claim 1, further comprising:
  a counter configured for counting a count value according to the oscillator output signal, and outputting the count value as an integral phase part, wherein the controller is configured to generate a DCO control signal for setting the oscillation frequency in accordance with the integral phase part and the fractional phase part of the oscillator output signal.

7. The circuit of claim 6, wherein the counter is activated to generate the integral phase part when a phase error of the oscillator output signal is larger than one oscillation period of the digitally-controlled oscillator.

8. The circuit of claim 1, further comprising:
  a loop filter disposed between the digitally-controlled oscillator and the controller;
  a sigma-delta modulator connected with the loop filter and the digitally-controlled oscillator, configured for synchronizing the digitally-controlled oscillator; and
  a reference phase accumulator (RPA) configured for receiving a frequency command word (FCW) and accordingly generating a reference phase signal to the controller.

9. The circuit of claim 1, wherein the circuit is an all-digital phase-locked loop (ADPLL).

10. A circuit, comprising:
  a phase finder configured for sampling an oscillator output signal with N-phased oscillator output signals to calculate an estimated value of a fractional phase part utilized for controlling an oscillation frequency of the oscillator output signal, wherein the oscillator output signal is generated by a digitally-controlled oscillator (DCO), the N-phased oscillator output signals are converted by a divider from the oscillator output signal, one oscillation period of the digitally-controlled oscillator is divided into N sub-periods, the phase finder detects which sub-period the oscillator output signal match; and
  a time-to-digital converter configured for one of the N-phased oscillator output signals with a reference-frequency signal to calculate a precise value of the fractional phase part within one sub-period.

11. The circuit of claim 10, wherein the phase finder is activated when a phase error of the oscillator output signal is larger than one sub-period.

12. The circuit of claim 10, wherein the phase finder is deactivated and the time-to-digital converter is activated when a phase error of the oscillator output signal is less than one sub-period.

13. The circuit of claim 10, further comprising a phase predictor configured for selecting one phase signal from the N-phased oscillator output signals according to a frequency command word (FCW), and providing the selected phase signal to the time-to-digital converter.

14. The circuit of claim 13, wherein the phase predictor comprises:
  a phase forwarder configured for predicting which sub-period will the next oscillator output signal match according to the frequency command word (FCW); and
  a multiplexer configured for selecting the phase signal from the N-phased oscillator output signals according to the prediction of the phase forwarder.

15. A method, comprising:
  determining a frequency control word for setting an oscillation frequency of an oscillator output signal;
  generating the oscillator output signal;

dividing one oscillation period of the digitally-controlled oscillator into N sub-periods;

detecting a phase error of the oscillator output signal;

if the phase error is less than one oscillation period of the oscillator output signal and larger than 1/N oscillation period, detecting which sub-period the oscillator output signal matches and calculating an estimated value of a fractional phase part;

if the phase error is less than 1/N oscillation period, calculating a precise value of the fractional phase part within one sub-period; and tuning the oscillator output signal according to the fractional phase part.

16. The phase-locked controlling method of claim 15, further comprising:

if the phase error is larger than one oscillation period of the oscillator output signal, activating a counter for counting an integral phase part according to the oscillator output signal; and tuning the oscillator output signal according to the integral phase part.

17. The phase-locked controlling method of claim 15, further comprising:

generating N-phased oscillator output signals from the oscillator output signal.

18. The phase-locked controlling method of claim 17, wherein the estimated value of the fractional phase part is calculated by sampling the oscillator output signal with the N-phased oscillator output signals.

19. The phase-locked controlling method of claim 15, wherein the precise value of the fractional phase part is calculated by sampling one of the N-phased oscillator output signal with the a reference-frequency signal.

* * * * *